United States Patent [19]

Hassett et al.

[11] Patent Number: 4,826,563
[45] Date of Patent: May 2, 1989

[54] CHEMICAL POLISHING PROCESS AND APPARATUS

[75] Inventors: Gerald M. Hassett, Lexington; Linda A. Palmaccio, Concord, both of Mass.

[73] Assignee: Honeywell Inc., Minneapolis, Minn.

[21] Appl. No.: 181,741

[22] Filed: Apr. 14, 1988

[51] Int. Cl.$^4$ .................. B44C 1/22; H01L 21/306
[52] U.S. Cl. .................................. 156/636; 156/639; 156/645; 156/662; 156/345; 252/79.1
[58] Field of Search ............ 156/636, 637, 639, 645, 156/662, 345, 903; 252/79.1, 79.2, 79.5; 51/281 R, 317, 293, 394

[56] References Cited

U.S. PATENT DOCUMENTS

| | | | |
|---|---|---|---|
| 3,549,439 | 12/1970 | Kaneggia et al. | 156/636 |
| 4,588,473 | 5/1986 | Hisatomi et al. | 156/903 X |
| 4,600,469 | 7/1986 | Fusco et al. | 156/636 |

*Primary Examiner*—William A. Powell
*Attorney, Agent, or Firm*—Lucas & Just

[57] ABSTRACT

A polyurethane disc having a reservoir and spokes cut therein is used in conjunction with potassium triiodide and ethylene glycol to polish mercury cadmium tellurium and cadmium tellurium electro-optical crystals. This process has been found to eliminate the need for lapping damage removal etch. The polyurethane disc is used with a lapping machine and run at low speed.

8 Claims, 1 Drawing Sheet

CHEMICAL POLISHING PROCESS AND APPARATUS

The U.S. Government has a paid-up license in this invention and the right in limited circumstances to require the patent owner to license others on reasonable terms as provided for by the terms of Contract No. F-33615-85-C-1868 awarded by the Air Force.

BACKGROUND OF THE INVENTION

1. Field of the Invention

This invention relates to polishing of electo-optical crystals and more specifically to chemical polishing of mercury cadmium tellurium and cadmium tellurium electro-optical crystals to a thickness of about 1 or about 2 microns across an area of several square millimeters.

2. Description of the Prior Art

Conventionally, electro-optical crystals are subject to a three step finishing process. The first step is a rough optical polish, the second step is a finishing polish to smooth the rough spots left by the first polishing step. Finally, the electro-optical crystals are demounted and subject to a dip etching to reduce the size of the electro-optical crystal to the desired thickness.

SUMMARY OF THE INVENTION

A chemical polishing process has been discovered that eliminates the etching step and replaces it with a chemical polishing step. This chemical polishing step eliminates the need to demount the electro-optical crystal and can be accomplished with a conventional precision lapping/optical polishing machine. The apparatus of the present invention employs a polyurethane disc into which a central reservoir and spokes extending out from the central reservoir to the edge of the polyurethane disc have been cut in conjunction with a conventional precision lapping/optical polishing machine. A chemical polishing solution of potassium triiodide ($KI_3$) and distilled water is employed in the reservoir and the spokes. A lubricant of ethylene glycol is added between the polyurethane disc and the electro-optical crystal during polishing.

This apparatus is employed to polish mercury cadmium tellurium or cadmium tellurium electro-optical crystals in conjunction with a conventional precision lapping/optical polishing machine. The polyurethane disc with its central reservoir and spokes is connected to the lapping side of the lapping machine. The reservoir is filled with a chemical polishing solution of potassium triiodide and distilled water which causes the spokes to fill up with the chemical polishing solution. The lapping machine is then run in a conventional manner at a slow speed. The thickness of the electro-optical crystal is thereby reduced/polished by the desired amount. Ethylene glycol is injected between the disc and the electro-optical crystal to help lubricate during the polishing process.

BRIEF DESCRIPTION OF THE DRAWINGS

For a more complete understanding of the invention, reference is hereby made to the drawings in which.

DESCRIPTION OF THE PREFERRED EMBODIMENT

Figure 1:
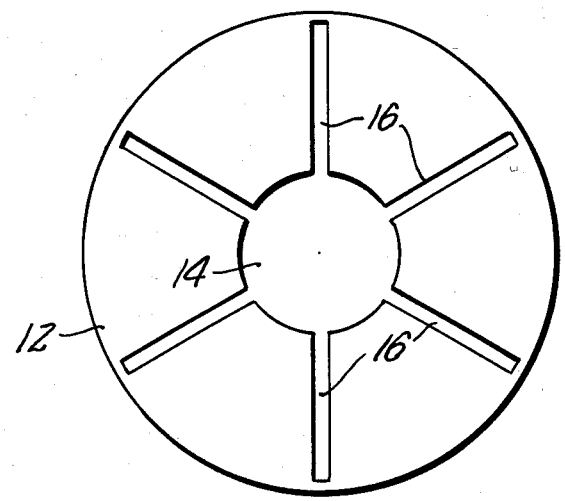
FIG. 1 is a top view of a polyurethane disc having a reservoir and spokes cut therein.

Referring to FIG. 1, a top view of polyurethane disc is shown having a reservoir 14 cut in its center and having spokes 16 extending out from the reservoir. Spokes 16 are in communication with reservoir 14 and terminates a distance from the edge of disc 12. The bottoms of reservoir 14 and spokes 16 are in approximately the same plane such that the level of the chemical polishing solvent 18 is at the same level throughout reservoir 14 and spokes 16.

Figure 2:
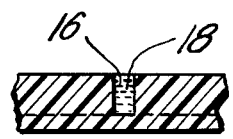
FIG. 2 is a side view of the polyurethane disc of FIG. 1 illustrating the depth of the spokes.

FIG. 2 illustrates a side view of the polyurethane disc 12 showing the depth of spoke 16 into disc 12. Spoke 16 is shown filled with chemical solution 18.

Figure 3:
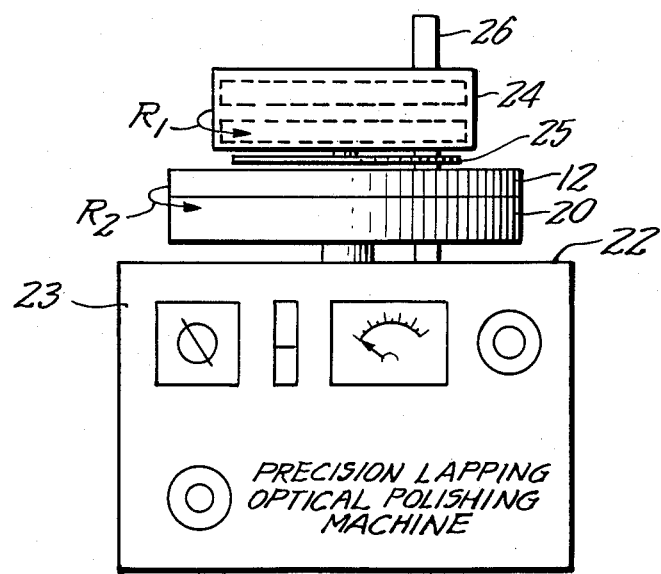
FIG. 3 is a schematic view of a portion of a lapping machine wherein the electro-optical crystal is being polished by the polyurethane disc.

Turning now to FIG. 3, this figure illustrates disc attached to aluminum plate 20 which in turn is attached to lap side 22 of conventional lapping machine 23. Opposite disc 12 is precision polishing jig 24 containing cadmium tellurium or mercury cadmium tellurium electro-optical crystals 25. Precision polishing jig 24 is attached to support frame 26 which in turn is attached to lapping machine 23.

In order to polish electro-optical crystals 25 mounted on precision polishing jig 24, chemical polishing solution 18 is first added to reservoir 14 and fills spokes 16. Precision polishing jig 24 is then brought into contact with disc 12 such that electro-optical crystals 25 are in contact with disc 12 and lapping machine 23 is run at a slow speed in a conventional manner. Preferably, the lapping machine is run at a speed of about 5 rpm. The operation of the lapping machine is conventional and, as is known to those of skill in the art, the precision polishing jig 24 turns electro-optical crystals 25 at a slightly slower rate than disc 12. Thus, rotational speed R1 is less than rotational speed R2. Ethylene glycol is injected between electro-optical crystals 25 and disc 12 periodically in order to lubricate electro-optical crystals 25 during polishing.

Polyurethane disc 12 is commercially available and is typically sold as an abrasive for high speed polishing of eyeglass lenses. Preferably, polyurethane disc 12 has a diameter greater than that of electro-optical crystals 25. Good results have been obtained with a polyurethane disc measuring about 30.5 cm in diameter.

Commercially available polyurethane discs do not have the reservoir and spokes cut therein. The reservoir and spokes are cut into the disc in a conventional manner. The depth of reservoir and spokes is preferably about equal and good results have been obtained when the spokes and reservoir is cut to a depth of about 25 mm. Good results have also been obtained with each spoke cut to a width of about 3.2 mm and with the reservoir measuring about 7.6 cm in diameter.

The polishing solution is preferably made up of between about 40% to about 60% potassium triiodide and between about 60% to about 40% distilled water. Good results have been obtained with a chemical polishing solution containing about 50% potassium triiodide and about 50% distilled water. The distilled water and potassium triiodide are from any commercially available source. It is preferred that the purity of both the distilled water and potassium triiodide be as high a purity as possible.

A lubricant is introduced between electro-optical crystals 25 and disc 12. Good results have been found by applying ethylene glycol during the polishing process between disc 12 and electro-optical crystals 25 such that the total concentration of ethylene glycol in the cleaning solution is about 10%. The ethylene glycol is from any commercially available source having a high degree of purity.

Polyurethane disc 12 is attached to aluminum plate 20 in a conventional manner and good results have been obtained by using a chemical adhesive which is not adversely affected by the potassium triiodide polishing solution.

Lapping machines are conventional pieces of equipment and good results have been obtained using a PM2A lapping machine manufactured by Logiteck of Glasgow, Scotland. In conjunction with the PM2A lapping machine, good results have been obtained using a PP5 precision polishing jig.

While there has been shown and described a preferred embodiment of the invention, those skill in the art will appreciate that various changes and modifications may be made to the illustrated embodiment without departing from the true spirit and scope of the invention which is to be determined from the appended claims.

The embodiments of the invention in which an exclusive property or right is claimed are defined as follows:

1. A system for chemically polishing a electro-optical crystal for use in conjunction with a lapping machine having a lap side and a work piece side, said work piece side having a plate of unmounted electro-optical crystals attached thereto, said system comprising:
   (a) a polyurethane disc having a reservoir and spokes cut therein, said reservoir in communication with said spokes, said polyurethane disc attached to said lap side of said lapping machine;
   (b) a chemical polishing solution comprising potassium triiodide and distilled water, said solution residing in said spokes and said reservoir; and
   (c) a lubricant introduced between said electro-optical crystals and said polyurethane disc when said polyurethane disc polishes said electro-optical crystals.

2. The system of claim 1 wherein said polyurethane disc has a diameter greater than the diameter of the plate of electro-optical crystals.

3. The system of claim 1 wherein the disc is about 30.5 cm in diameter and about 5 mm thick and has a reservoir about 7.6 cm in diameter and the reservoir and spokes have a depth of about 25 mm.

4. The system of claim 1 wherein the lapping machine is operated at about 5 RPM for polishing.

5. A method for chemically polishing an electro-optical crystal comprising the steps of:
   (a) attaching an electro-optical crystal to a lapping machine on the work piece side of the lapping machine;
   (b) cutting reservoir and spokes in a polyurethane disc;
   (c) affixing the cut polyurethane disc to the lapping machine on the lap side of said lapping machine;
   (d) adding a chemical polishing solution comprising potassium triiodide and distilled water to the reservoir and spokes;
   (e) adding a lubricant on said cut polyurethane disc; and
   (f) polishing at low speed the electro-optical crystal with the polyurethane disc.

6. The method of claim 5 wherein the polishing is conducted at a speed of about 5 RPM.

7. The method of claim 5 wherein the chemical polishing solution comprises a mixture of 50% potassium triiodide and 50% distilled water.

8. The method of claim 5 wherein the lubricant is ethylene glycol.

* * * * *